US009276142B2

(12) United States Patent
Peng et al.

(10) Patent No.: US 9,276,142 B2
(45) Date of Patent: Mar. 1, 2016

(54) METHODS FOR FORMING A TRANSPARENT OXIDE LAYER FOR A PHOTOVOLTAIC DEVICE

(75) Inventors: Hongying Peng, Niskayuna, NY (US); Robert Dwayne Gossman, Arvada, CO (US); Juan Carlos Rojo, Niskayuna, NY (US); Steven Jude Duclos, Clifton Park, NY (US)

(73) Assignee: First Solar, Inc., Tempe, AZ (US)

( * ) Notice: Subject to any disclaimer, the term of this patent is extended or adjusted under 35 U.S.C. 154(b) by 456 days.

(21) Appl. No.: 13/306,392

(22) Filed: Nov. 29, 2011

(65) Prior Publication Data

US 2012/0156828 A1 Jun. 21, 2012

Related U.S. Application Data

(63) Continuation-in-part of application No. 12/972,242, filed on Dec. 17, 2010, now abandoned.

(51) Int. Cl.
*H01L 31/0224* (2006.01)
*H01L 31/0392* (2006.01)
*H01L 31/073* (2012.01)
*H01L 31/18* (2006.01)

(52) U.S. Cl.
CPC .. *H01L 31/022466* (2013.01); *H01L 31/03925* (2013.01); *H01L 31/073* (2013.01); *H01L 31/1884* (2013.01); *Y02E 10/543* (2013.01); *Y02P 70/521* (2015.11)

(58) Field of Classification Search
CPC ............... H01L 31/022466; H01L 31/03925; H01L 31/1884; H01L 31/073
USPC ..................... 438/98; 257/E31.126
See application file for complete search history.

(56) References Cited

U.S. PATENT DOCUMENTS

| 3,811,953 | A | 5/1974 | Nozik |
|---|---|---|---|
| 4,371,740 | A | 2/1983 | Clem |
| 4,605,565 | A | 8/1986 | Nath |
| 5,922,142 | A | 7/1999 | Wu et al. |

(Continued)

FOREIGN PATENT DOCUMENTS

| GB | 2013724 A | 10/1978 |
|---|---|---|
| GB | 2405030 A | 10/1978 |

(Continued)

OTHER PUBLICATIONS

X. Wu, W.P. Mulligan, T.J. Courts;"Recent developments in RF sputtered cadmium starmate films",Thin Solid Films, Elsevier,Received Oct. 17, 1995; accepted Dec. 15, 1995,(1996),vol. 286,pp. 274-276.

(Continued)

*Primary Examiner* — Walter H Swanson
(74) *Attorney, Agent, or Firm* — MacMillan, Sobanski & Todd, LLC (57) ABSTRACT

A method of manufacturing a transparent oxide layer is provided. The manufacturing method includes disposing a cadmium tin oxide layer on a support, placing the support with the cadmium tin oxide layer within a chamber of a rapid thermal annealing system, and rapidly thermally annealing the cadmium tin oxide layer by exposing the cadmium tin oxide layer to electromagnetic radiation to form the transparent oxide layer, wherein the rapid thermal anneal is performed without first pumping down the chamber.

29 Claims, 3 Drawing Sheets

(56) References Cited

U.S. PATENT DOCUMENTS

| | | | |
|---|---|---|---|
| 6,137,048 A | 10/2000 | Wu et al. | |
| 6,169,246 B1 | 1/2001 | Wu et al. | |
| 6,221,495 B1 | 4/2001 | Wu et al. | |
| 6,288,325 B1 | 9/2001 | Jansen et al. | |
| 7,597,964 B2 | 10/2009 | Krasnov | |
| 7,648,783 B2 | 1/2010 | Huang et al. | |
| 2001/0054436 A1 | 12/2001 | Mukai et al. | |
| 2003/0134122 A1* | 7/2003 | Wickboldt et al. | 428/411.1 |
| 2008/0169021 A1 | 7/2008 | Krasnov | |
| 2009/0242019 A1 | 10/2009 | Ramamoorthy et al. | |
| 2009/0272437 A1 | 11/2009 | Roberts et al. | |
| 2010/0055826 A1 | 3/2010 | Zhong et al. | |
| 2010/0126575 A1 | 5/2010 | Bailat et al. | |
| 2010/0288354 A1 | 11/2010 | Mills et al. | |
| 2010/0319775 A1 | 12/2010 | Mills et al. | |
| 2011/0020971 A1 | 1/2011 | Sun et al. | |
| 2011/0083724 A1 | 4/2011 | Ovshinsky | |
| 2011/0139240 A1 | 6/2011 | Allenic et al. | |
| 2012/0000519 A1* | 1/2012 | Frey | 136/256 |
| 2012/0107996 A1* | 5/2012 | Sheng et al. | 438/71 |
| 2013/0068287 A1* | 3/2013 | Compaan | 136/249 |

FOREIGN PATENT DOCUMENTS

| | | | |
|---|---|---|---|
| KR | 10-2010-0108959 | * | 10/2010 |
| WO | 9847702 A1 | | 10/1998 |

OTHER PUBLICATIONS

Radhouane Bel Hadj Tahal, Takayuki Ban ,Yutaka Ohya ,Yasutaka Takahashi;"Effect of Processing Parameters on Physical Properties of Cadmium Stannate Thin Films Prepared by a Dip-Coating Technique", Journal of the American Ceramic Society, Jan. 2001, vol. 84, Issue 1, pp. 85-91.

Gintaras Valincius, Vytautas Reipa, Vincent Vilker, John T Woodward, Mark Vaudin; Electrochemical properties of Nanocrystalline cadmium stannate films, Journal of the Electrochemical Society, Electrochemical Society, Pennington,2001, vol. 148, No. 8, pp. E341-E347.

X Wu, R.G. Dhere, J. Zhou, A. Duda, C. Perkins, Y. Yan, H.R. Moutinho;"High-Quality Cadmium Stannate Transparent Conductive Oxide Film far Tandem Thin-Film Solar Cells",3rd World Conference on Phoiovollaic Enera' Conversion, May 2003, 4 Pages.

X. Li et al;"The properties of cadmium tin oxide thin-film compounds prepared by linear combinatorial synthesis", National Renewable Energy Laboratory,Science direct,Elsevier,Applied Surface Science,(2004),vol. 223, pp. 138-143.

Robert Mamazza Jr., Don L Morel, Christos S Ferekides;"Transparent conducting oxide thin films of Cd2SnO4 prepared by RF magnetron co-sputtering of the constituent binary oxides ",Science direct, Elsevier,Thin Solid films,(2005),vol. 484,pp. 26-33.

C.S. Ferekides, R. Mamazza, U. Balasubramanian, D.L. Morel;"Transparent conductors and buffer layers for CdTe solar cells",Science direct, Elsevier,Thin Solid films,(2005), vol. 480-481, pp. 224-229.

Wu et al., "13.9%-Efficient CdTe Polycrystalline Thin-Film Solar Cells with an Infrared Transmission of ~50%", Progress in Photovoltaics: Research and Applications, vol. 14, Issue 6, pp. 471-483, Sep. 2006.

Wu et al., "Recent Developments in RF Sputtered Cadmium Stannate Films", Thin Solid Films 286, (1996), pp. 274-276.

Wu et al., "Application of Cd2SnO4 Transparent Conducting Oxides in CdS/CdTe Thin-Film Devices", National Renewable Energy Lab (NREL), 1617 Cole Blvd, Golden, CO 80401, 26th PVSC, Sep. 30-Oct. 3, 1997, Anaheim, CA, pp. 347-350.

Tahar et al., "Effect of Processing Parameters on Physical Properties of Cadmium Stannate Thin Films Prepared by a Dip-Coating Technique", J. Am. Ceram. Soc, 84 [1], pp. 85-91, 2001.

Hashemi et al., "A Novel Method of Producing Dicadmium Stannate in Thin Film Form", Journal of Materials Science 24, pp. 615-617, 1989.

Haacke et al., "Sputter Deposition and Characterization of Cd2SnO4 Films", Thin Solid Films, vol. 55, Issue 1, Nov. 1978, pp. 67-81.

CN First Office Action, Application No. 201110437614.2, dated May 20, 2015.

Mamazza Jr., et al., "Transparent conducting oxide thin films of Cd2SnO4 prepared by RF magnetron co-sputtering of the constituent binary oxides", Thin Solid Films, 2005, vol. 484, pp. 26-33.

* cited by examiner

METHODS FOR FORMING A TRANSPARENT OXIDE LAYER FOR A PHOTOVOLTAIC DEVICE

CROSS REFERENCE TO RELATED APPLICATIONS

This application is a continuation in part of U.S. patent application Ser. No. 12/972,242, Joseph Darryl Michael et al., entitled "Method for forming cadmium tin oxide layer and a photovoltaic device," which patent application is hereby incorporated by reference herein in its entirety.

BACKGROUND

The invention relates to methods for forming photovoltaic (PV) devices. More particularly, the invention relates to methods for forming a transparent oxide layer in a photovoltaic device.

PV (or solar) cells are used for converting solar energy into electrical energy. Typically, in its basic form, thin film solar cells or photovoltaic devices typically include a number of semiconductor layers disposed on a transparent support, where one semiconductor layer serves as a window layer, and a second semiconductor layer serves as an absorber layer. Solar radiation travels through the window layer to the absorber layer, where the optical energy is converted to usable electrical energy. Additional layers are often employed to enhance the conversion efficiency of the PV device.

There are a variety of candidate material systems for PV cells, each of which has certain advantages and disadvantages. Cadmium telluride/cadmium sulfide (CdTe/CdS) heterojunction-based photovoltaic cells are one such example of thin film solar cells.

Typically, a thin layer of transparent conductive oxide (TCO) is deposited between the support and the window layer (for example, CdS) to function as a front contact current collector. However conventional TCOs, such as fluorine-doped tin oxide, indium tin oxide, and aluminum-doped zinc oxide, have high electrical resistivities at the thicknesses necessary for good optical transmission. The use of cadmium tin oxide (CTO) as a TCO provides better electrical, optical, and mechanical properties, as well as stability at elevated temperatures. In addition, for certain configurations, to achieve high device efficiencies with thin CdS films, a thin layer of a buffer material, such as an undoped tin oxide ($SnO_2$) layer, may be intercalated between the cadmium tin oxide (CTO) and the window (CdS) layers.

Typically, to form a transparent CTO layer, a layer of amorphous cadmium tin oxide is deposited on a support, followed by slow thermal annealing of the CTO layer, which is in contact or in close proximity with a CdS film, to achieve desired transparency and resistivity. However, CdS-based annealing of CTO is difficult to implement in a large-scale manufacturing environment. Specifically, it is very difficult to assemble and disassemble the plates before and after the annealing process, typically requiring manual intervention of the operator, and there is a high risk of misalignment that may result in the sublimation of the CTO film. Further, the use of expensive CdS on a non-reusable glass plate for each annealing step increases the cost of manufacturing. The high annealing temperatures (>550° C.) employed for thermal processing of the CTO film, further do not allow for the use of less expensive low softening temperature supports, such as, for example, soda-lime glass.

After crystallization of CTO is achieved, a separate buffer layer (for example, undoped tin oxide) may be deposited on the CTO layer, which may be further followed by a second annealing step to obtain good crystalline quality. The performance of the buffer layer usually depends in part on the crystallinity and morphology of that layer and is affected by the surface of the CTO on which it is deposited. A high quality buffer layer is desirable to obtain the desired performance in the solar cells manufactured therefrom.

Thus, there is a need to reduce the number of steps for depositing and annealing of CTO and optional buffer layers during manufacturing of photovoltaic devices, resulting in reduced costs and improved manufacturing capability. Further, there is a need to provide cost-effective electrodes and photovoltaic devices manufactured using cadmium tin oxide having the desired electrical and optical properties.

BRIEF DESCRIPTION

One aspect of the present invention resides in a method of manufacturing a transparent oxide layer. The manufacturing method includes disposing a cadmium tin oxide layer on a support, placing the support with the cadmium tin oxide layer within a chamber of a rapid thermal annealing system, and rapidly thermally annealing the cadmium tin oxide layer by exposing the cadmium tin oxide layer to electromagnetic radiation to form the transparent oxide layer. The rapid thermal anneal is performed without first pumping down the chamber.

Another aspect of the present invention resides in a method of manufacturing a transparent oxide layer. The manufacturing method includes disposing a cadmium tin oxide layer on a support, placing the support with the cadmium tin oxide layer within a chamber of a rapid thermal annealing system, and rapidly thermally annealing the cadmium tin oxide layer by exposing the cadmium tin oxide layer to electromagnetic radiation to form the transparent oxide layer. Air is disposed within the chamber during the rapid thermal anneal at a concentration of at least one percent (1%) by volume.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The modifier "about" used in connection with a quantity is inclusive of the stated value, and has the meaning dictated by context, (e.g., includes the degree of error associated with measurement of the particular quantity). In addition, the term "combination" is inclusive of blends, mixtures, alloys, reaction products, and the like.

Moreover, in this specification, the suffix "(s)" is usually intended to include both the singular and the plural of the term that it modifies, thereby including one or more of that term. Reference throughout the specification to "one embodiment," or "another embodiment," "an embodiment," and so forth, means that a particular element (e.g., feature, structure, and/or characteristic) described in connection with the embodiment is included in at least one embodiment described herein, and may or may not be present in other embodiments. Similarly, reference to "a particular configuration" means that a particular element (e.g., feature, structure, and/or characteristic) described in connection with the configuration is included in at least one configuration described herein, and may or may not be present in other configurations. In addition, it is to be understood that the described inventive features may be combined in any suitable manner in the various embodiments and configurations.

In addition, approximating language, as used herein throughout the specification and claims, may be applied to modify any quantitative representation that could permissibly vary without resulting in a change in the basic function to which it is related. Accordingly, a value modified by a term or terms, such as "about", is not limited to the precise value specified. In some instances, the approximating language may correspond to the precision of an instrument for measuring the value.

Further, the terms "transparent region", "transparent layer" and "transparent electrode" as used herein, refer to a region, a layer, or an article that allows an average transmission of at least 80% of incident electromagnetic radiation having a wavelength in a range from about 300 nm to about 850 nm. As used herein, the term "disposed on" refers to layers disposed directly in contact with each other or indirectly by having intervening layers there between.

Figure 1:
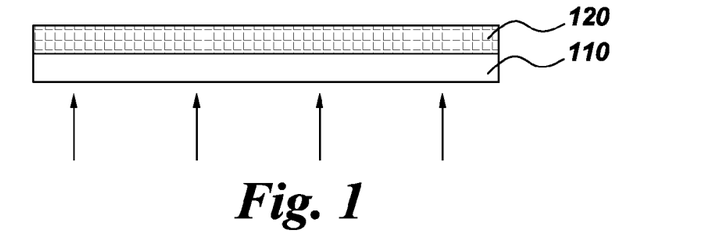
FIG. 1 schematically depicts, in cross-sectional view, a cadmium tin oxide layer disposed on a support, for use as a transparent oxide layer in a photovoltaic device.

A method of manufacturing a transparent oxide layer 120 is described with reference to FIGS. 1-9. As indicated in FIG. 1, the manufacturing method includes disposing a cadmium tin oxide (CTO) layer 120 on a support 110. The CTO layer 120 may be disposed directly on the support, as indicated in FIG. 1, or one or more intervening layers may be disposed between the CTO layer 120 and the support 110, as discussed below with reference to FIG. 2.

As used herein, the term "cadmium tin oxide" refers to a composition of cadmium, tin, and oxygen. For certain configurations, the cadmium tin oxide may comprise a stoichiometric composition of cadmium and tin, where, for example, the atomic ratio of cadmium to tin is about 2:1. For other configurations, the cadmium tin oxide may comprise a non-stoichiometric composition of cadmium and tin, where, for example, the atomic ratio of cadmium to tin is in range less than about 2:1 or greater than about 2:1. As used herein, the terms "cadmium tin oxide" and "CTO" may be used interchangeably. The cadmium tin oxide may further include one or more dopants, such as, for example, copper, zinc, calcium, yttrium, zirconium, hafnium, vanadium, tin, ruthenium, magnesium, indium, zinc, palladium, rhodium, titanium, or combinations thereof. "Substantially amorphous cadmium tin oxide" as used herein refers to a cadmium tin oxide layer that does not have a distinct crystalline pattern as observed by X-ray diffraction (XRD). The CTO layer 120 will typically be deposited as a substantially amorphous CTO layer, as discussed below.

The cadmium tin oxide may function as a transparent conductive oxide (TCO). The use of cadmium tin oxide as a TCO has numerous advantages including superior electrical, optical, surface, and mechanical properties and increased stability at elevated temperatures when compared to tin oxide, indium oxide, indium tin oxide, and other transparent conductive oxides. The electrical properties of cadmium tin oxide may depend in part on the composition of cadmium tin oxide characterized in some embodiments by the atomic concentration of cadmium and tin, or alternatively in some other embodiments by the atomic ratio of cadmium to tin in cadmium tin oxide. The atomic ratio of cadmium to tin, as used herein, refers to the ratio of the atomic concentration of cadmium to tin in cadmium tin oxide. Atomic concentrations of cadmium and tin and the corresponding atomic ratio are commonly measured using, for instance, x-ray photoelectron spectroscopy (XPS).

For particular configurations, the atomic ratio of cadmium to tin in the CTO layer 120 is in a range from about 1.2:1 to about 3:1, and more particularly, in a range from about 1.5:1 to about 2.5:1, and still more particularly, in a range from about 1.7:1 to about 2.15:1. For particular configurations, the atomic ratio of cadmium to tin in the CTO layer 120 is in a range from about 1.4:1 to about 2:1.

For particular configurations, the atomic concentration of cadmium in the CTO layer 120 may be in a range of about 20-40% of the total atomic content of the CTO, and more particularly, in a range of about 25-35% of the total atomic content of the CTO, and still more particularly, about 28-32% of the total atomic content of the CTO. For particular configurations, the atomic concentration of tin in the CTO layer 120 may be in a range of about 10-30% of the total atomic content of the CTO, and more particularly, in a range of about 15-28% of the total atomic content of the CTO, and still more particularly, in a range of about 18-24% of the total atomic content of the CTO. For particular configurations, the atomic concentration of oxygen in the CTO layer 120 may be in a range of about 30-70% of the total atomic content of the CTO, and more particularly, in a range of about 40-60% of the total atomic content of the CTO, and still more particularly, in a range of about 44-50% of the total atomic content of the CTO.

The CTO layer 120 may be disposed on the support 110 by any suitable technique, such as sputtering, chemical vapor deposition, spin coating, spray coating, or dip coating. For example, a substantially amorphous CTO layer 120 may be formed by dipping a support 110 into a solution of a reaction product containing cadmium and tin derived from a cadmium compound and a tin compound.

A substantially amorphous CTO layer 120 may also be disposed on the support 110 by sputtering. For example, the CTO layer 120 may be disposed on the support 110 by radio frequency (RF) sputtering or direct current (DC) sputtering. The CTO layer 120 may also be disposed on the support 110 by reactive sputtering in the presence of oxygen.

For particular processes, a ceramic cadmium tin oxide target may be used in disposing a substantially amorphous CTO layer 120 on the support 110. For other processes, a substantially amorphous CTO layer 120 may be disposed on the support 110 by co-sputtering using cadmium oxide and tin oxide targets or by sputtering from a single target including a blend of cadmium oxide and tin oxide. Reactive sputtering may also be employed using a single metallic target, where the metal target includes a mixture of cadmium and tin metals or by reactive co-sputtering using two different metal targets, that is, a cadmium target and a tin target. The sputtering target(s) may be manufactured, formed, or shaped by any process and in any shape, composition, or configuration suitable for use with any appropriate sputtering tool, machine, apparatus, or system.

When depositing a substantially amorphous CTO layer 120 on the support 110 by sputtering, the atomic concentration of cadmium and tin in the deposited layer may be directly proportional to the atomic concentration of cadmium and tin in the sputtering target(s). For particular processes, the atomic ratio of cadmium to tin in the sputtering target(s) is in a range from about 1.4:1 to about 3:1, and more particularly, in a range from about 1.5:1 to about 2.5:1, and still more particularly, in a range from about 1.7:1 to about 2.15:1. For particular processes, the atomic ratio of cadmium to tin in the sputtering target(s) is in a range from about 1.4:1 to about 2:1.

The thickness of the CTO layer 120 may be controlled by varying one or more of the deposition process parameters. For example, the thickness of the CTO layer 120 may be engineered to be in a range of about 50-600 nm, and more particularly, in a range of about 100-500 nm, and still more particularly, in a range from about 200-400 nm.

Referring again to FIG. 1, the support 110 may be transparent over the range of wavelengths for which transmission through the support 110 is desired. In one embodiment, the support 110 may be transparent to visible light having a wavelength in a range of about 400-1000 nm. The material for the support 110 may be selected such that the thermal expansion coefficient of the support 110 is close to the thermal expansion coefficient of the CTO layer 120 to prevent cracking or buckling of the substantially amorphous CTO layer 120 during heat treatments. For particular configurations, other layers may be disposed between the CTO layer 120 and the support 110, such as, for example, a reflective layer or a barrier layer 190, which is discussed below with reference to FIG. 2.

For certain configurations, the support 110 may comprise a material capable of withstanding heat treatment temperatures greater than about 600° C., such as, for example silica and borosilicate glass. However, beneficially, the support 110 may comprise a material that has a softening temperature lower than 600° C., such as, for example, soda-lime glass. Typically, it is not possible to use supports such as soda-lime glass for annealing of CTO because the annealing temperatures employed are greater than 600° C., which is greater than the softening temperature of soda-lime glass. Thus, use of supports such as soda lime glass is not feasible for fabrication of photovoltaic devices where temperatures greater than 600° C. are employed for annealing. Beneficially, the rapid thermal anneal used in the present manufacturing method (and described below) results in a rapid temperature increase of the support-CTO assembly and avoids continuous exposure of the support to temperatures greater than 600° C. for an extended time period. Without being bound by any particular theory, it is believed that the rapid thermal annealing step may heat the CTO layer much faster than the support due to the greater absorption of energy by the CTO layer. Accordingly, the rapid thermal anneal may allow the CTO layer to be heated to a temperature greater than the support, thus annealing the CTO layer without softening the support. Thus, the present manufacturing method advantageously allows for use of low softening temperature (less than 600° C.) supports, such as, for example, soda-lime glass for forming a photovoltaic device.

Figures 8, 9:
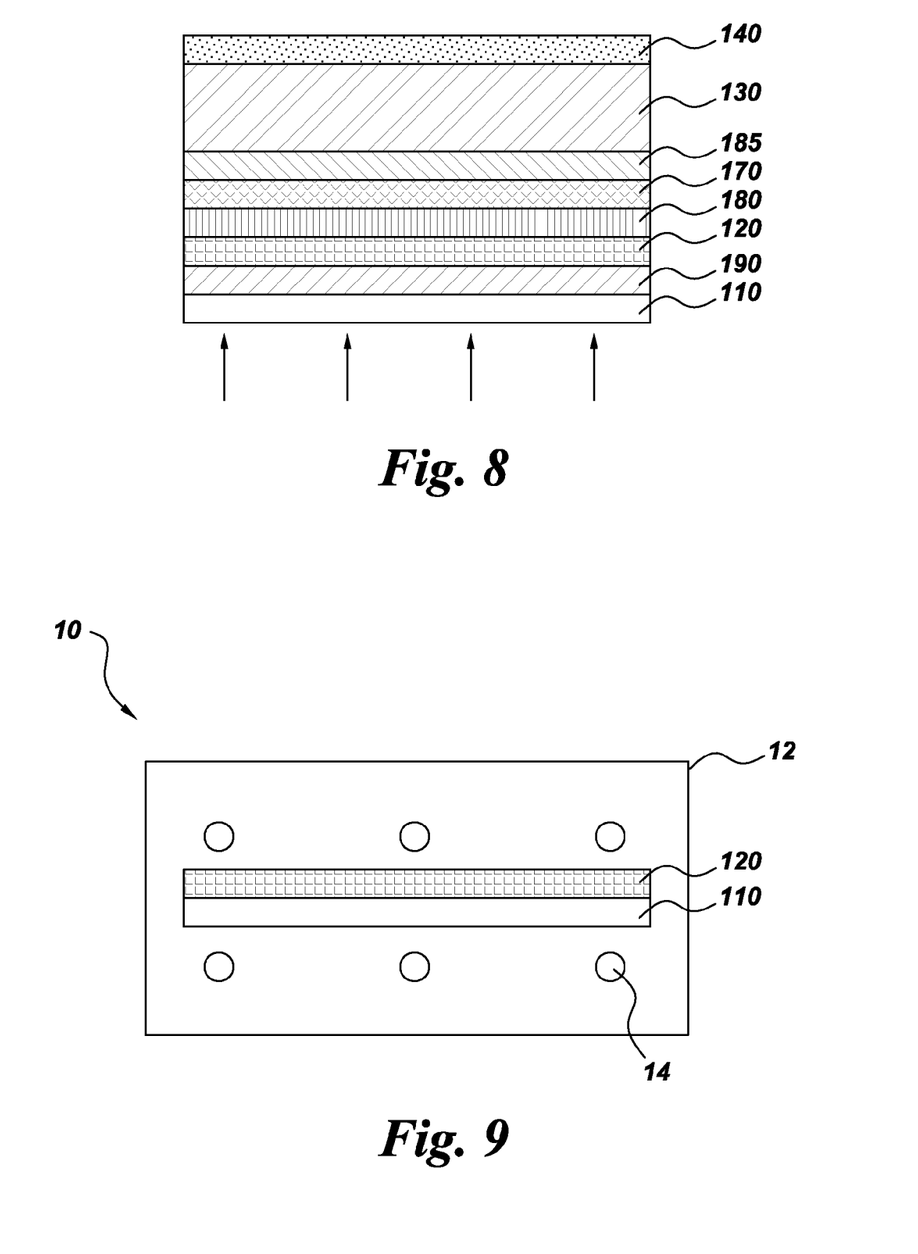
FIG. 8 schematically depicts, in cross-sectional view, a photovoltaic device that includes a transparent oxide layer formed using the manufacturing method of the present invention.
FIG. 9 schematically depicts a cadmium tin oxide layer/support assembly disposed within a chamber of a rapid thermal annealing system for in-line rapid thermal annealing of the cadmium tin oxide layer.

Referring now to FIG. 9, the manufacturing method further includes placing the support 110 with the CTO layer 120 within a chamber 12 of a rapid thermal annealing system 10 and rapidly thermally annealing the CTO layer 120 by exposing the cadmium tin oxide layer 120 to electromagnetic radiation to form the transparent oxide layer 120. The transparent oxide layer 120 disposed on the support 110 may form a transparent electrode 200. The rapid thermal anneal is performed without first pumping down the chamber 12. Thus, air is disposed within the chamber 12 during the rapid thermal anneal Beneficially, because the rapid thermal anneal is performed in air, without first pumping down the chamber 12 and purging the chamber of air, the time required to complete the rapid thermal anneal is reduced considerably, enabling the in-line performance of the rapid thermal anneal of the CTO layer 120 to form the transparent oxide layer (also indicated by reference numeral 120 herein). For example, the rapid thermal anneal of the CTO layer 120 may be performed in less than fifteen minutes, and more particularly, in less than five minutes, and still more particularly, in less than three minutes. Thus, for particular processes, the rapid thermal anneal of the CTO layer 120 may be performed in-line, such that the rapid thermal anneal is completed less than ten minutes after the deposition of the CTO layer (120) has been completed.

In contrast, for the method disclosed in U.S. patent application Ser. No. 12/972,242, Joseph Darryl Michael et al., "Method for forming cadmium tin oxide layer and a photovoltaic device," the rapid thermal anneal may be carried out under vacuum conditions, as explained in paragraph [0067] thereof. However, performing a rapid thermal anneal under vacuum conditions requires that the chamber be pumped and purged, which may be time consuming and require relatively expensive equipment. Although the time required to perform the rapid thermal anneal itself may be relatively quick (on the order of a few minutes), the time required to complete the entire anneal process (including pumping the chamber down and purging the chamber of air) is relatively long (typically over thirty minutes). Thus, rapid thermal annealing under vacuum is typically not suited for in-line annealing of the CTO layer 120, as the overall process time is too long to satisfy the requirements of in-line processing. Instead, the CTO-support assemblies would have to be removed from the manufacturing line after the CTO (or other layers) is (are) deposited and annealed offline using the earlier rapid thermal anneal under vacuum technique. Beneficially, the present manufacturing method eliminates the need to first pump the chamber down, thus facilitating performing the rapid thermal anneal inline, while permitting the use of less expensive equipment to perform the anneal.

The rapid thermal anneal may be performed using a variety of techniques. Generally, the terms "rapidly thermally annealing" and "rapid thermal annealing," as used herein, refer to irradiating the CTO layer 120 at an incident power density in a range greater than about 200 Watts/cm$^2$ to form a substantially crystalline CTO layer 120. The term "incident power density," as used herein, refers to the power incident on the first surface 122 of the CTO layer 120 per unit surface area. For particular processes, rapid thermally annealing comprises irradiating a surface of the CTO layer 120 at an incident power density such that the heating rate that the CTO layer is subjected to is greater than about 20° C./second, and more particularly, greater than about 100° C./second. The term "heating rate," as used herein, refers to the average rate at which the CTO layer is heated, to reach the desired annealing temperature. Further, for particular processes, rapid thermally annealing comprises irradiating a surface of the CTO layer 120 at an incident power density and at a heating rate, such that the desired annealing temperature is reached in less than about 60 seconds.

The term "electromagnetic radiation," as used herein, refers to radiation with electric and magnetic components. Electromagnetic (EM) radiation may be classified by wavelength into radio, microwave, infrared, visible region, ultraviolet (UV), X-rays and gamma rays. For example, infrared radiation is characterized by a wavelength greater than about 700 nm. For particular processes, rapid thermal annealing of the CTO layer 120 may comprise exposing the substantially amorphous CTO layer 120 to high intensity EM radiation, such that controlled annealing of the CTO layer 120 is achieved. For example, rapid thermal annealing of the CTO layer 120 may comprise exposing the CTO layer 120 to high intensity infrared radiation, such that the CTO layer 120 absorbs a significant portion of photons.

For particular processes, rapid thermal annealing of the CTO layer 120 comprises exposing the CTO layer 120 to a high intensity EM radiation with a defined intensity-wavelength spectrum, such that the CTO layer 120 absorbs a significant portion of the incident light. As will be appreciated by those skilled in the art, the absorption profiles of crystalline CTO and amorphous CTO differ. Accordingly, the optical properties of amorphous (pre-anneal) and crystalline (post-anneal) CTO may be advantageously used to achieve rapid thermal annealing in a controlled manner.

As discussed in U.S. patent application Ser. No. 12/972, 242, Joseph Darryl Michael et al., "Method for forming cadmium tin oxide layer and a photovoltaic device," by heating the CTO layer with EM radiation characterized by wavelengths less than 300 nm may allow for more stable annealing of an amorphous CTO layer, as changes in optical properties of the CTO layer after annealing may not affect the power absorbed by the layer. For particular processes, the CTO layer 120 may be annealed using UV radiation characterized by wavelengths less than about 300 nm. It should be noted that the term "a wavelength in a range" refers to EM radiation having a spectrum of wavelengths in that range and is not limited to a single wavelength or monochromatic radiation.

For particular processes, the CTO layer 120 may be annealed using EM radiation characterized by wavelengths less than about 600 nm. As discussed in U.S. patent application Ser. No. 12/972,242, the absorption profile of crystalline CTO shows a significant reduction in absorption between a wavelength range of about 350-600 nm. Accordingly, in such instances, the amount of power absorbed by the crystalline CTO layer is lower than the power density absorbed by the substantially amorphous CTO layer. Accordingly, in such embodiments, the heating rate of the substantially crystalline CTO layer may be lower than the substantially amorphous CTO layer, thus reducing the possibility of over-heating of the crystalline CTO layer.

For particular processes, the CTO layer 120 may be annealed using EM radiation characterized by wavelengths in a range of about 450-600 nm. As discussed in U.S. patent application Ser. No. 12/972,242, in this range, the rapid thermal annealing process may function essentially as a "self-limiting" process, that is, the act of crystallization prevents the CTO layer from overheating. More generally, the selected wavelength range employed for rapid thermal annealing may depend in part on the optical characteristics of the initial amorphous CTO layer, the optical properties of the resulting crystalline CTO layer, and the photon spectrum of the radiation source that is used.

As discussed in U.S. patent application Ser. No. 12/972, 242, an incoherent light source may be employed to perform the rapid thermal anneal of the CTO layer 120. The term "light" as used herein refers to electromagnetic radiation as defined above. The term "incoherent light" encompasses both light with different wavelengths, as well as light with the same wavelength but that is out of phase. Further, the term "incoherent light source" encompasses both a single light source, as well as multiple light sources. Example incoherent light sources include halogen lamps, UV lamps, and high intensity discharge lamps. Example lamps are indicated by reference numeral 14 in FIG. 9. It should be noted that the number and placement of the lamps 14 in FIG. 9 is purely illustrative. For certain RTA systems, the lamps may be on one side, and for others the lamps are disposed on different sides of the sample being heated (as shown in FIG. 9, for example). The incoherent light source may be configured to emit pulsed EM radiation, for example the incoherent light source may emit EM radiation at a fixed pulsed width, such that the duration of the exposure of the CTO layer to the EM radiation is characterized by the pulse width. An incoherent light source that emits EM radiation at a variable pulsed width may also be employed. In addition to the pulse width, the incoherent light source may be further characterized by the incident power density and the lamp power. Example incident power densities for the incoherent light source may be in a range of about 100-500 watts/cm$^2$ and, more particularly, in a range of about 200-400 watts/cm$^2$. Example lamp powers for the incoherent light source may be in a range of about 1.4-2 kW and, more particularly, in a range from about 1.4-1.8 kW. The overall lamp power may be provided by a single or multiple lamps, depending on the specific implementation. Further, the lamps may have the same or different powers.

During the rapid thermal anneal, the CTO layer may be exposed to the EM radiation for about 1-180 seconds, and more particularly, for about 5-120 seconds, and still more particularly, for about 10-90 seconds. In addition, the rapid thermal anneal may include multiple exposures of the CTO layer to the EM radiation. For example, the light source may be pulsed n times, wherein n is a range in a range from 2-20, and more particularly, may be pulsed 2-8 times. Depending on the specific implementation, the pulse width may be the same for each thermal annealing step or may be varied for the different pulses. The number of pulses and/or the pulse width may vary depending in part on the thickness of the support 110, the thickness of the CTO layer 120, and/or the incident power density.

As discussed in U.S. patent application Ser. No. 12/972, 242, the EM radiation is absorbed by the CTO layer 120 and converted into thermal energy, resulting in a rapid increase in temperature of the layer, which concerts the substantially amorphous CTO to a substantially crystalline CTO. The percentage of this conversion may depend in part on the amount of incident power density absorbed by the substantially amorphous CTO layer 120 and the thermal losses from the layer 120. Depending on the specific process employed, the substantially amorphous CTO 120 layer may absorbs at least 10 percent of the incident power density, and more particularly, at least 50 percent of the incident power density, and still more particularly, at least 80 percent of the incident power density. As noted above, the amount of power density absorbed by the substantially amorphous CTO layer 120 may be advantageously controlled in part by tuning the energy wavelength spectra of the EM radiation. This, in turn, controls the heating rate and/or the treatment temperature. For particular processes, a substantially amorphous CTO layer 120 is heated at a treatment temperature in a range of about 700-1200° C., and more particularly, in a range of about 700-900° C., and still more particularly, in a range of about 800-900° C. Treatment temperature as used herein refers to the temperature of the CTO layer after being exposed to the EM radiation for a time duration sufficient to perform the anneal.

As noted above, rapid thermal annealing of the CTO layer 120 results in the formation of a transparent layer 120. The resulting transparent layer 120 may comprise a substantially uniform single-phase polycrystalline CTO. For particular configurations, the substantially crystalline cadmium tin oxide may have an inverse spinel crystal structure. Beneficially, the transparent layer may have the desired electrical and optical properties and may function as a transparent conductive oxide (TCO) layer. For certain configurations, the resulting transparent layer 120 may further include an amorphous component, such as for example, amorphous cadmium oxide, amorphous tin oxide, or combinations thereof.

The transparent layer may be further characterized by its thickness, electrical properties, and/or optical properties. For particular configurations, the transparent layer 120 has a thickness in a range of about 100-600 nm, and more particularly, in a range of about 150-450 nm, and still more particularly, in a range of about 100-400 nm. For particular configurations, the transparent layer 120 has an average electrical resistivity ($\rho$) that is less than about $4\times10^{-4}$ Ohm-cm, and more particularly, less than about $2\times10^{-4}$ Ohm-cm, and still more particularly, less than about $1.5\times10^{-4}$ Ohm-cm. For example, resistivities ($\rho$) as low as about $1.4\times10^{-4}$ Ohm-cm have been achieved for the transparent oxide layer 120. For particular configurations, the transparent layer 120 has an average optical transmission greater than about 80 percent and, more particularly, greater than about 95 percent. For particular configurations, the resulting transparent oxide layer 120 has a sheet resistance $R_{sh}$ less than about 7.5 Ohm/sq and, more particularly, the sheet resistance $R_{sh}$ of the resulting transparent oxide layer 120 may be less than about 6.0 Ohm/sq.

Although the rapid thermal anneal is performed with air in the chamber 12, the manufacturing method may further include flowing an inert gas or air (i.e., a continuous purging gas flow) through the chamber 12 during the rapid thermal anneal. For example, an inert gas, such as nitrogen or argon, or alternatively, additional air, may be flowed through the chamber during the rapid thermal anneal (RTA) in order to help collect any vapor escaping from the CTO during the RTA and to help direct the vapor towards a collector (not shown), such as a (relatively) cool surface to capture the vapor. However, even for this specific process, it is not necessary to pump the chamber down prior to the RTA. Instead, the inert gas is simply used to help purge the chamber 12 of vapors escaping from the CTO during the anneal, and the anneal is still performed with air in the chamber 12. However, when the chamber is continuously purged with an inert gas during the RTA, the oxygen level in the chamber may be as low as about 100-500 parts per million (ppm) for larger PV modules.

In addition to the support 110/CTO 120 assembly shown in FIG. 1, the rapid thermal anneal may be performed on a number of related structures, and the invention is not limited to a specific support/CTO assembly. For example, for the configuration shown in FIG. 3, the manufacturing method further includes disposing a resistive, transparent buffer layer 170, for example a zinc tin oxide layer 170, on the CTO layer 120. For particular configurations, the zinc tin oxide comprises zinc stannate. Other suitable materials for the resistive, transparent buffer layer 170 include, without limitation, include tin oxide, indium oxide ($In_2O_3$), zinc oxide, gallium oxide, aluminum oxide, ZnS:O, $In(OH)_3$, $Mg_{1-x}Cd_xTe$, MnSe, and $Mn_{1-x}Zn_xSe$ (x=0.5–1), cadmium tin oxide, $CdO—SnO_2$, and mixtures thereof. Beneficially, the resistive, transparent buffer layer 170 may help to reduce the likelihood of having weak diodes and/or shunts within the overall photovoltaic device.

Figure 3:
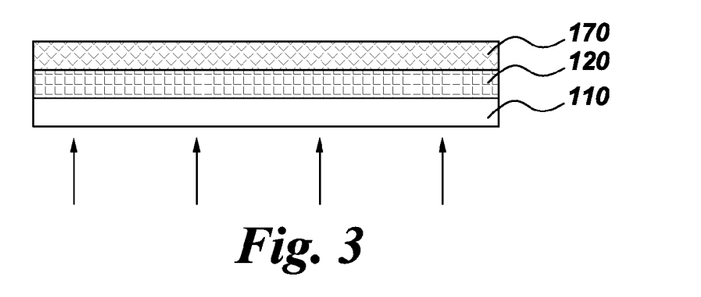
FIG. 3 schematically depicts, in cross-sectional view, a resistive, transparent buffer layer disposed on the cadmium tin oxide layer/support assembly shown in FIG. 1.

For particular processes, the resistive, transparent buffer layer 170 may be disposed on the CTO layer 120 prior to performing the rapid thermal anneal, such that the resistive, transparent buffer layer 170 also undergoes the rapid thermal anneal. However, for other processes, the resistive, transparent buffer layer 170 may be disposed on the CTO layer 120 after the rapid thermal anneal of the CTO layer, such that the heating of the resistive, transparent buffer layer 170 occurs, for example, during the subsequent deposition of the absorber layer 130.

Figure 4:
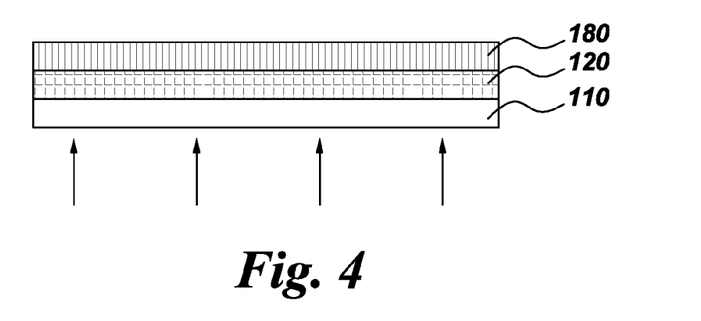
FIG. 4 schematically depicts, in cross-sectional view, a conductive layer disposed on the cadmium tin oxide layer/support assembly shown in FIG. 1.

Similarly, for the configuration shown in FIG. 4, the manufacturing method further includes disposing a conductive layer 180 on the cadmium tin oxide layer 120. For particular processes, the conductive layer 180 may be disposed on the cadmium tin oxide layer 120 prior to performing the rapid thermal anneal, such that the conductive layer 180 is oxidized during the RTA, becoming an optically transparent metal oxide layer 180. Example materials for the conductive layer 180 include, without limitation, tin, aluminum, nickel, tantalum, titanium, indium, vanadium, zirconium, zinc, indium monoxide, tin monoxide, and titanium monoxide, and combinations or alloys thereof. Thus, after the RTA, a tin layer 180 would comprise a tin oxide layer (also indicated by reference numeral 180), for example. The other materials would similarly be oxidized, rendering them optically transparent. For particular configurations, the conductive layer comprises tin. For particular configurations, the conductive layer 180 is less than about 30 nm in thickness, and more particularly, has a thickness in a range of about 3-30 nm, and still more particularly has a thickness in a range of about 7-15 nm. In one non-limiting example, a ten nanometer (10 nm) thick tin layer 180 was disposed on the CTO layer 120. However, the specific thickness selected for the conductive layer 180 will vary depending on the thickness of the CTO layer 120. Beneficially, the conductive layer 180 serves as a "getter" layer in that it prevents oxygen from penetrating into the CTO layer 120.

Figure 2:
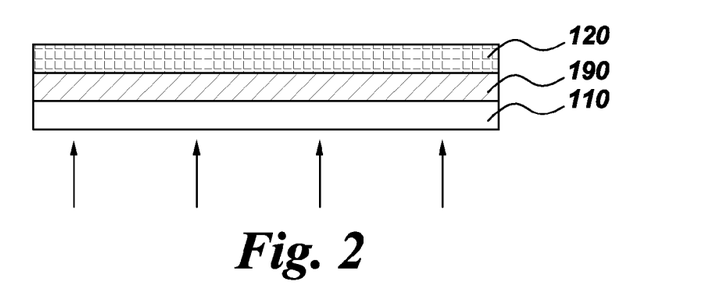
FIG. 2 schematically depicts, in cross-sectional view, a barrier layer disposed between the cadmium tin oxide layer and the support shown in FIG. 1.
Figure 5:
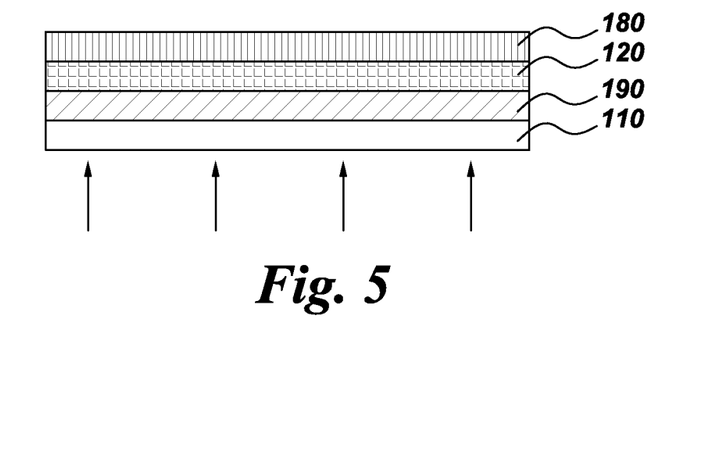
FIG. 5 schematically depicts, in cross-sectional view, a conductive layer disposed on the cadmium tin oxide layer/barrier layer/support assembly shown in FIG. 2.

Similarly, for the configurations shown in FIGS. 2 and 5, the manufacturing method further includes disposing a barrier layer 190 on the support 110 prior to disposing the CTO layer 120, such that the barrier layer 190 is disposed between the support 110 and the CTO layer 120. Non-limiting example materials for the barrier layer include silicon dioxide ($SiO_2$), trisilicon tetranitride ($Si_3N_4$), aluminum oxide ($Al_2O_3$), silicon oxynitride ($SiO_xN_y$), as well as multilayer structures, such as $SiO_2/Si_3N_4$.

Figure 6:
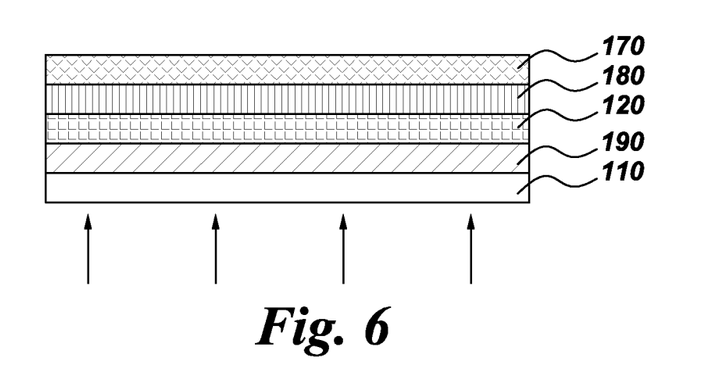
FIG. 6 schematically depicts, in cross-sectional view, a resistive, transparent buffer layer disposed on the conductive layer/cadmium tin oxide layer/barrier layer/support assembly shown in FIG. 5.

Similarly, for the configurations shown in FIGS. 5 and 6, the manufacturing method further includes disposing a conductive layer 180 on the CTO layer 120. For particular processes, the conductive layer 180 is disposed on the CTO layer 120 prior to performing the rapid thermal anneal (RTA), such that the conductive layer 180 becomes an optically transparent metal oxide layer 180. As noted above, suitable materials for the conductive layer include tin, aluminum, nickel, tantalum, titanium, indium, vanadium, zirconium, zinc, indium monoxide, tin monoxide, and titanium monoxide, and combinations or alloys thereof. For particular configurations, a tin layer 180 with a thickness in a range of about 7-15 nm is disposed on the CTO layer 120 prior to performing the RTA.

In addition, for the configurations shown in FIGS. 6 and 7, the manufacturing method further includes disposing a resistive, transparent buffer layer 170 on the optically transparent metal oxide layer 180 (for example, disposing a zinc tin oxide layer 170 on a tin oxide layer 180), in which case the heating of the transparent buffer layer 170 occurs primarily during the deposition of the absorber layer (discussed below with reference to FIG. 8). However, for other processes (also illustrated by FIGS. 6 and 7), the resistive, transparent buffer layer 170 is disposed on the conductive layer 180 prior to performing the RTA, such that the resistive, transparent buffer layer 170 also undergoes the RTA.

Figure 7:
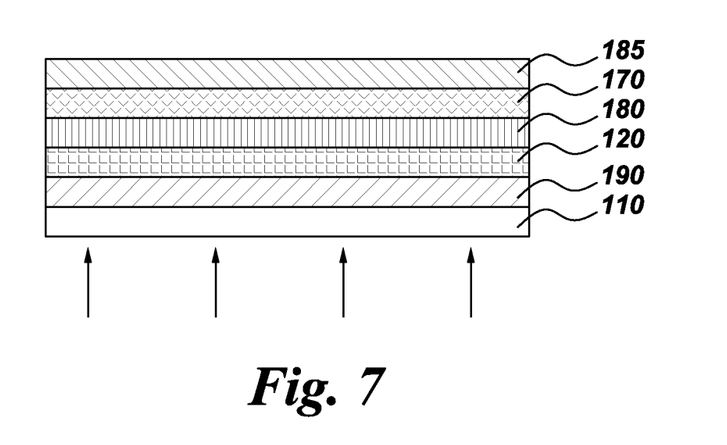
FIG. 7 schematically depicts, in cross-sectional view, a semiconductor layer disposed on the resistive, transparent buffer layer/conductive layer/cadmium tin oxide layer/barrier layer/support assembly shown in FIG. 6.

For the configuration shown in FIG. 7, the manufacturing method further includes disposing a semiconductor layer 185 on the resistive, transparent buffer layer 170. For example a CdS layer 185 may be disposed on a zinc tin oxide layer 170.

Depending on the particular process, the CdS 185 layer may be deposited before or after the rapid thermal anneal (RTA). For particular processes, the CdS 185 layer is deposited after the RTA. Other suitable materials for semiconductor layer 185 include indium (III) sulfide ($In_2S_3$), zinc sulfide (ZnS), zinc telluride (ZnTe), zinc selenide (ZnSe), cadmium selenide (CdSe), oxygenated cadmium sulfide (CdS:O), copper oxide ($Cu_2O$), amorphous or micro-crystalline silicon and Zn(O,H) and combinations thereof.

A particular method of manufacturing a transparent oxide layer 120 for use in a photovoltaic device 100 is described with reference to FIGS. 1-9. As discussed above with reference to FIGS. 1 and 9, the manufacturing method includes disposing a cadmium tin oxide (CTO) layer 120 on a support 110 and placing the support 110 with the cadmium tin oxide layer 120 within a chamber 12 of a rapid thermal annealing system 10. Suitable compositions and deposition techniques for the CTO layer 120 are provided above. The manufacturing method further includes rapidly thermally annealing the CTO layer 120 (for example, a substantially amorphous CTO layer 120) by exposing the CTO layer 120 to electromagnetic (EM) radiation to form the transparent oxide layer 120. Suitable techniques for performing the rapid thermal anneal are provided above. Air is disposed within the chamber during the rapid thermal anneal at a concentration of at least one percent (1%) by volume.

Beneficially, by performing the rapid thermal anneal (RTA) in air, there is no need to first pump the chamber 12 down prior to the RTA. As discussed above, this considerably reduces the overall time needed to perform the RTA, thereby in-line rapid thermal annealing of the CTO layer in a production setting, which increases throughput and reduces cost (both unit cost and capital costs, as relatively expensive vacuum handling systems can be avoided for the RTA system 10. As also note above, the manufacturing method may further include flowing an inert gas or air (i.e., a continuous purging gas flow) through the chamber 12 during the rapid thermal anneal. For example, this may be performed to help collect any vapor escaping from the CTO during the RTA and to help direct the vapor towards a collector (not shown), such as a (relatively) cool surface to capture the vapor. However, even for this specific process, it is not necessary to pump the chamber down prior to the RTA. Instead, the inert gas is simply used to help purge the chamber 12 of vapors escaping from the CTO during the anneal, and the anneal is still performed with air in the chamber 12. However, when the chamber is continuously purged with an inert gas during the RTA, the oxygen level in the chamber may be as low as about 100-500 parts per million (ppm) for larger PV modules.

As described above with reference to FIGS. 2-7, a number of additional layers may optionally be deposited to improve the function of the PV device 100. For example and as discussed above with reference to FIG. 3, the manufacturing method may further optionally include disposing a resistive, transparent buffer layer 170 on the cadmium tin oxide layer 120. Example materials for the buffer layer include, without limitation, zinc tin oxide (for example, zinc stannate), tin oxide, indium oxide, zinc oxide, gallium oxide, aluminum oxide, ZnS:O, $In(OH)_3$, $Mg_{1-x}Cd_xTe$, MnSe, and $Mn_{1-x}Zn_xSe$ (x=0.5–1), cadmium tin oxide, $CdO-SnO_2$, and combinations thereof. As noted above, the resistive, transparent buffer layer 170 may beneficially help to reduce the likelihood of having weak diodes and/or shunts within the overall photovoltaic device. As also noted above, the resistive, transparent buffer layer 170 may be disposed on the cadmium tin oxide layer 120 prior to performing the rapid thermal anneal, such that the resistive, transparent buffer layer 170 also undergoes the rapid thermal anneal. For other processes, the resistive, transparent buffer layer 170 may be disposed on the CTO layer 120 after the rapid thermal anneal of the CTO layer, such that the heating of the resistive, transparent buffer layer 170 may occur primarily during the subsequent deposition of the absorber layer 130.

For particular processes, the rapid thermal anneal of the cadmium tin oxide layer 120 is performed is performed in-line, such that the rapid thermal anneal may be completed less than ten minutes after the deposition of the cadmium tin oxide layer 120 has been completed. This ability to perform the rapid thermal anneal in-line is particularly beneficial. For example, the takt time for depositing the CTO layer 120 may be approximately one minute, for particular manufacturing processes. So by achieving a comparable takt time for the rapid thermal anneal, the footprint for the annealing chamber 12 may be roughly comparable to the footprint for the CTO deposition system (not shown). In contrast, for a rapid thermal annealing process performed under vacuum (namely, a process that required a pump and purge cycle), the total takt time for the rapid thermal anneal may be at least 15-30 minutes, in which case the footprint for the annealing chamber 12 would have to be about 15-30 times the footprint for the CTO deposition system in order to perform the rapid thermal anneal under vacuum in-line with the CTO deposition. This would be prohibitively expensive, thereby necessitating the performance of a RTA under vacuum off-line as a batch process in order to control the overall capital cost for the manufacturing facility.

Referring now to FIG. 4, the manufacturing method may further optionally include disposing a conductive layer 180 on the CTO layer 120 prior to performing the rapid thermal anneal (RTA). Example materials for the conductive layer 180 include, without limitation, tin, aluminum, nickel, tantalum, titanium, indium, vanadium, zirconium, zinc, indium monoxide, tin monoxide, and titanium monoxide, and combinations or alloys thereof. For example a tin layer 180 with a thickness in a range of about 3-30 nm may be deposited on the CTO layer 120 prior to the RTA. As noted above, the conductive layer 180 beneficially serves as a "getter" layer to prevent oxygen from penetrating the into the CTO layer 120. As also noted above, the conductive layer is oxidized during the RTA, such that the post-anneal layer 180 comprises an optically transparent oxide of the initially deposited metal. For example, after the RTA, a tin layer 180 would comprise a tin oxide layer (also indicated by reference numeral 180).

Referring now to FIGS. 2 and 5-7, the manufacturing method may further optionally include disposing a barrier layer 190 on the support 110 prior to disposing the CTO layer 120, such that the barrier layer 190 is disposed between the support 110 and the CTO layer 120. Example materials for the barrier layer 190 are listed above. In addition, the manufacturing method may further optionally include disposing a conductive layer 180 on the CTO layer 120, as indicated in FIG. 5. The conductive layer 180 may be deposited prior to performing the rapid thermal anneal, such that the conductive layer (180) becomes an optically transparent metal oxide layer 180. Further, the manufacturing method may also optionally include disposing a resistive, transparent buffer layer 170 (for example a zinc tin oxide layer 170) on the optically transparent metal oxide layer 180, as shown for example in FIG. 6. For certain processes, the resistive, transparent buffer layer 170 may be disposed on the conductive layer 180 prior to performing the rapid thermal anneal, such that the resistive, transparent buffer layer 170 also undergoes the rapid thermal anneal. However, for other processes, the resistive, transparent buffer layer 170 may be disposed on the optically transparent metal oxide layer 180 after performing the rapid thermal anneal, such that the resistive, transparent buffer layer 170 may not be heated until the subsequent deposition of the absorber layer 130 (as discussed below with reference to FIG. 8). In addition, and as indicated for example in FIG. 7, the manufacturing method may also optionally include disposing a semiconductor layer 185 on the resistive, transparent buffer layer 170. For example a CdS layer 185 may be disposed on a zinc tin oxide layer 170 before or after the RTA, depending on the particular process. Other suitable materials for the semiconductor layer 185 are provided above.

In addition, the manufacturing method for the photovoltaic device 100 will typically further include disposing an absorber layer 130 on the semiconductor layer 185, as indicated, for example, in FIG. 8. The absorber layer may comprise a material selected from the group consisting of cadmium telluride, cadmium zinc telluride, cadmium sulfur telluride, cadmium manganese telluride, cadmium magnesium telluride and combinations thereof. As noted above, the semiconductor layer 185 may comprise a material selected from the group consisting of cadmium sulfide (CdS), indium (III) sulfide ($In_2S_3$), zinc sulfide (ZnS), zinc telluride (ZnTe), zinc selenide (ZnSe), cadmium selenide (CdSe), oxygenated cadmium sulfide (CdS:O), copper oxide ($Cu_2O$), amorphous or micro-crystalline silicon and Zn(O,H) and combinations thereof. These materials should also be understood to include the alloys thereof. For example, CdTe can be alloyed with zinc, magnesium, manganese, and/or sulfur to form cadmium zinc telluride, cadmium copper telluride, cadmium manganese telluride, cadmium magnesium telluride and combinations thereof. It bears noting that the above-mentioned photoactive semiconductor materials may be used alone or in combination. Further, these materials may be present in more than one layer, each layer having different type of photoactive material or having combinations of the materials in separate layers.

For particular configurations, the absorber layer 130 comprises a p-type material, for example p-type CdTe, and has a thickness less than about three (3) μm and, more particularly, has a thickness less than about two (2) μm, and less than about 1.5 μm for certain configurations. The materials listed above may be actively doped to be p-type. Suitable dopants vary based on the semiconductor material. For CdTe, suitable p-type dopants include, without limitation, copper, gold, nitrogen, phosphorus, antimony, arsenic, silver, bismuth, and sodium.

Further, the manufacturing method for the photovoltaic device 100 will typically also include disposing a second electrically conductive layer 140 on the absorber layer 130, as indicated in FIG. 8, for example. Although not expressly shown, the manufacturing method for the PV device 100 may further optionally include disposing one or more layers between the absorber layer 130 and the second electrically conductive layer 140. For example, a p+ layer (not shown) could be disposed between the absorber 130 and the back contact 140 (FIG. 8) to reduce the electrical resistance between the absorber and the back contact. Example materials for the second electrically conductive layer 140 include, without limitation gold, platinum, molybdenum, aluminum, chromium, nickel, and silver. In addition, for certain configurations, another metal layer (not shown), for example, aluminum, may be disposed on the second electrically conductive layer 140 to provide lateral conduction to the outside circuit. For the arrangement shown in FIG. 8, the second electrically conductive layer 140 serves as the back contact for the superstrate-based PV device 100.

EXAMPLE 1

A 300 nm thick layer of CTO was deposited by reactive sputtering of Cd/Sn target in a 100% oxygen environment on a borosilicate glass substrate. The resulting assembly was then subjected to a rapid thermal anneal (RTA) in standard ambient air conditions using a square quartz holder (not shown) using a RTA system sold under the tradename AS-One 100, which is commercially available from ANNEALSYS. The maximum power for this RTA system is 30 KW. The maximum sample size this RTA system can accommodate is 100 mm. The RTA was performed at a lamp power of 85% (which corresponds to about 25.5 kW for this 30 kW system, and which is equivalent to 325 W/cm$^2$) for 55 seconds and resulted in a transparent layer with a sheet resistance $R_{sh}$ of 5.7 Ohms/sq, an average electrical resistivity ($\rho$) of $1.71 \times 10^{-4}$ Ohm-cm, and a weighted absorption of 3.84%.

EXAMPLE 2

A 20 nm thick $Si_3N_4/SiO_2$ barrier later was deposited by RF sputtering on a borosilicate glass substrate. A 300 nm thick layer of CTO was deposited by RF sputtering of a ceramic CTO target on the barrier layer. A 15 nm thick layer of tin was deposited on the CTO by DC sputtering. The resulting assembly was then subjected to a rapid thermal anneal (RTA) in standard ambient air conditions using a square quartz holder (not shown) using the AS-One 100 RTA system from ANNEALSYS. The RTA was performed at a lamp power of 85% (which is equivalent to 325 W/cm$^2$) for 27 seconds and resulted in a transparent layer with a sheet resistance $R_{sh}$ of 5.985 Ohms/sq, an average electrical resistivity ($\rho$) of $1.80 \times 10^{-4}$ Ohm-cm, and a weighted absorption of 4.71%.

EXAMPLE 3

A 20 nm thick $Si_3N_4/SiO_2$ barrier later was deposited by RF sputtering on a borosilicate glass substrate. A 300 nm thick layer of CTO was deposited by RF sputtering of ceramic CTO target on the barrier layer. A 15 nm thick layer of tin was deposited on the CTO by DC sputtering. The resulting assembly was then subjected to a rapid thermal anneal (RTA) in standard ambient air conditions using a graphite susceptor (not shown) using the AS-One 100 RTA system from ANNEALSYS. The RTA was performed using two pulses, the first pulse at a lamp power of 30% (equivalent to 115 W/cm$^2$) for 60 seconds, and the second pulse at a lamp power of 20% for 30 seconds and resulted in a transparent layer with a sheet resistance $R_{sh}$ of 4.687 Ohms/sq, an average electrical resistivity ($\rho$) of $1.41 \times 10^{-4}$ Ohm-cm, and a weighted absorption of 5.16%.

EXAMPLE 4

A 20 nm thick $Si_3N_4/SiO_2$ barrier later was deposited by RF sputtering on a borosilicate glass substrate. A 300 nm thick layer of CTO was deposited by RF sputtering of a ceramic CTO target on the barrier layer. The resulting assembly was then subjected to a rapid thermal anneal (RTA) in standard ambient air conditions using a graphite susceptor (not shown) using the AS-One 100 RTA system from ANNEALSYS. The RTA was performed using two pulses, the first pulse at a lamp power of 30% (equivalent to 115 W/cm$^2$) for 60 seconds, and the second pulse at a lamp power of 20% for 30 seconds and resulted in a transparent layer with a sheet resistance $R_{sh}$ of 7.2 Ohms/sq, an average electrical resistivity ($\rho$) of $2.16 \times 10^{-4}$ Ohm-cm, and a weighted absorption of 4.83%.

Beneficially, because the rapid thermal anneal is performed in air, without first pumping down the chamber and purging the chamber of air, the time required to complete the rapid thermal anneal is reduced considerably, enabling the in-line performance of the rapid thermal anneal of the CTO layer to form the transparent oxide layer. In addition, the reduced processing time reduces the footprint for this processing step and may reduce the equipment cost as well.

Although only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method of manufacturing a photovoltaic device having a transparent oxide layer, the manufacturing method comprising:
   disposing a cadmium tin oxide layer on a support;
   placing the support with the cadmium tin oxide layer within a rapid thermal anneal chamber;
   performing a rapid thermal anneal of the cadmium tin oxide layer by exposing the cadmium tin oxide layer to electromagnetic radiation to form the transparent oxide layer, wherein the rapid thermal anneal is performed without first pumping down the chamber, and wherein the rapid thermal anneal of the cadmium tin oxide layer is performed in-line, such that the rapid thermal anneal is completed less than ten minutes after the cadmium tin oxide layer has been disposed on the support; and
   disposing at least one additional layer on the transparent oxide layer, the additional layer comprising a semiconductor layer.

2. The manufacturing method of claim 1, wherein air is disposed within the chamber during the rapid thermal anneal.

3. The manufacturing method of claim 1, further comprising flowing an inert gas or air through the chamber during the rapid thermal anneal.

4. The manufacturing method of claim 1, further comprising disposing a resistive, transparent buffer layer on the cadmium tin oxide layer.

5. The manufacturing method of claim 4, wherein the resistive, transparent buffer layer comprises a material selected from the group consisting of zinc tin oxide, zinc stannate, tin oxide, indium oxide, zinc oxide, gallium oxide, aluminum oxide, cadmium tin oxide, $CdO-SnO_2$ and combinations thereof and is disposed on the cadmium tin oxide layer prior to performing the rapid thermal anneal, such that the resistive, transparent buffer layer also undergoes the rapid thermal anneal.

6. The manufacturing method of claim 1, wherein the rapid thermal anneal of the cadmium tin oxide layer is performed in between about one second and about five minutes.

7. The manufacturing method of claim 6, wherein the rapid thermal anneal of the cadmium tin oxide layer is performed in between about one second and about three minutes.

8. The manufacturing method of claim 1, wherein the transparent oxide layer has a sheet resistance $R_{sh}$ between about 4.7 Ohm/sq and about 7.5 Ohm/sq.

9. The manufacturing method of claim 1, wherein the transparent oxide layer has an electrical resistivity ($\rho$) between about $1.4 \times 10^{-4}$ Ohm-cm and about $2.2 \times 10^{-4}$ Ohm-cm.

10. The manufacturing method of claim 9, wherein the transparent oxide layer has an electrical resistivity ($\rho$) of about $1.4 \times 10^{-4}$ Ohm-cm.

11. The manufacturing method of claim 1, further comprising disposing a conductive layer on the cadmium tin oxide layer.

12. The manufacturing method of claim 11, wherein the conductive layer is disposed on the cadmium tin oxide layer prior to performing the rapid thermal anneal, such that the conductive layer becomes an optically transparent metal oxide layer.

13. The manufacturing method of claim 11, wherein the conductive layer comprises a material selected from the group consisting of tin, aluminum, nickel, tantalum, titanium, indium, vanadium, zirconium, zinc, indium monoxide, tin monoxide, and titanium monoxide, and combinations or alloys thereof.

14. The manufacturing method of claim 13, wherein the conductive layer has a thickness in a range of about three to about thirty nanometers (3-30 nm).

15. The manufacturing method of claim 1, further comprising disposing a barrier layer on the support prior to disposing the cadmium tin oxide layer, such that the barrier layer is disposed between the support and the cadmium tin oxide layer.

16. The manufacturing method of claim 15, further comprising disposing a conductive layer on the cadmium tin oxide layer.

17. The manufacturing method of claim 16, wherein the conductive layer is disposed on the cadmium tin oxide layer prior to performing the rapid thermal anneal, such that the conductive layer becomes an optically transparent metal oxide layer, the manufacturing method further comprising disposing a resistive, transparent buffer layer on the optically transparent metal oxide layer.

18. The manufacturing method of claim 17, further comprising disposing a semiconductor layer on the resistive, transparent buffer layer.

19. A method of manufacturing a photovoltaic device having a transparent oxide layer, the manufacturing method comprising:
- disposing a barrier layer on a support;
- disposing a cadmium tin oxide layer on the barrier layer to form an assembly;
- placing the assembly within a rapid thermal anneal chamber;
- performing a rapid thermal anneal of the cadmium tin oxide layer by exposing the cadmium tin oxide layer to electromagnetic radiation to form the transparent oxide layer, wherein air is disposed within the chamber during the rapid thermal anneal at a concentration of at least one percent (1%) by volume; and
- disposing at least one additional layer on the transparent oxide layer, the additional layer comprising a semiconductor layer.

20. The manufacturing method of claim 19, further comprising flowing an inert gas or air through the chamber during the rapid thermal anneal.

21. The manufacturing method of claim 19, further comprising disposing a resistive, transparent buffer layer on the cadmium tin oxide layer.

22. The manufacturing method of claim 21, wherein the resistive, transparent buffer layer is disposed on the cadmium tin oxide layer prior to performing the rapid thermal anneal, such that the resistive, transparent buffer layer also undergoes the rapid thermal anneal.

23. The manufacturing method of claim 19, wherein the rapid thermal anneal of the cadmium tin oxide layer is performed in-line, such that the rapid thermal anneal is completed less than ten minutes after the cadmium tin oxide layer has been disposed on the support.

24. The manufacturing method of claim 19, further comprising disposing a conductive layer on the cadmium tin oxide layer prior to performing the rapid thermal anneal, such that the conductive layer becomes an optically transparent metal oxide layer, wherein the conductive layer comprises a material selected from the group consisting of tin, aluminum, nickel, tantalum, titanium, indium, vanadium, zirconium, zinc, indium monoxide, tin monoxide, and titanium monoxide, and combinations or alloys thereof, and wherein the conductive layer has a thickness in a range of about 3-30 nm.

25. The manufacturing method of claim 19, further comprising disposing a conductive layer on the cadmium tin oxide layer prior to performing the rapid thermal anneal, such that the conductive layer becomes an optically transparent metal oxide layer, wherein the conductive layer comprises a material selected from the group consisting of tin, aluminum, nickel, tantalum, titanium, indium, vanadium, zirconium, zinc, indium monoxide, tin monoxide, and titanium monoxide, and combinations or alloys thereof.

26. The manufacturing method of claim 25, further comprising disposing a resistive, transparent buffer layer on the conductive layer prior to performing the rapid thermal anneal, such that the resistive, transparent buffer layer also undergoes the rapid thermal anneal.

27. The manufacturing method of claim 25, further comprising disposing a resistive, transparent buffer layer on the optically transparent metal oxide layer.

28. The manufacturing method of claim 27, further comprising disposing a semiconductor layer on the resistive, transparent buffer layer.

29. A method of manufacturing a photovoltaic device having a transparent oxide layer, the manufacturing method comprising:
- disposing a cadmium tin oxide layer on a support;
- disposing a conductive layer on the cadmium tin oxide layer to form an assembly;
- exposing the conductive layer of the assembly to electromagnetic radiation to perform a rapid thermal anneal and conduct heat to the cadmium tin oxide layer, thereby forming the transparent oxide layer, wherein air is disposed within the chamber during the rapid thermal anneal at a concentration of at least one percent (1%) by volume; and
- disposing at least one additional layer on the transparent oxide layer, the additional layer comprising a semiconductor layer.

* * * * *